United States Patent
Odanaka et al.

(10) Patent No.: US 7,961,471 B2
(45) Date of Patent: Jun. 14, 2011

(54) IMAGE PROCESSING APPARATUS WITH HEAT DISSIPATING STRUCTURE

(75) Inventors: Satoshi Odanaka, Kanagawa (JP); Hayato Watanabe, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 131 days.

(21) Appl. No.: 12/115,826

(22) Filed: May 6, 2008

(65) Prior Publication Data

US 2008/0285224 A1 Nov. 20, 2008

(30) Foreign Application Priority Data

May 15, 2007 (JP) ................. 2007-128799

(51) Int. Cl.
*H05K 7/20* (2006.01)
*F28F 7/00* (2006.01)
*H01L 23/34* (2006.01)

(52) U.S. Cl. .............. 361/711; 361/679.46; 361/679.54; 361/697; 361/719; 361/709; 165/80.3; 165/185; 257/713; 174/16.3; 174/547

(58) Field of Classification Search .......... 361/679.46–679.47, 679–57, 697, 361/704, 707, 709, 711, 719; 165/80.2–80.3, 165/185; 257/712–713, 721, 722; 174/15.1, 174/16.1, 16.3, 547, 548

See application file for complete search history.

(56) References Cited

U.S. PATENT DOCUMENTS

| | | | | |
|---|---|---|---|---|
| 5,949,644 A * | 9/1999 | Park | .......... | 361/679.32 |
| 6,320,748 B1 * | 11/2001 | Roden et al. | .......... | 361/704 |
| 6,365,964 B1 * | 4/2002 | Koors et al. | .......... | 257/718 |
| 6,597,569 B1 * | 7/2003 | Unrein | .......... | 361/679.4 |
| 7,180,747 B2 * | 2/2007 | Lee | .......... | 361/720 |
| 2005/0078448 A1 * | 4/2005 | Kunz | .......... | 361/690 |
| 2006/0219852 A1 | 10/2006 | Kawai et al. | | |
| 2006/0256515 A1 | 11/2006 | Watanabe | | |
| 2007/0167055 A1 | 7/2007 | Watanabe | | |
| 2007/0285887 A1 * | 12/2007 | Chang | .......... | 361/687 |
| 2007/0291450 A1 | 12/2007 | Watanabe | | |

FOREIGN PATENT DOCUMENTS

JP 2006-301816 11/2006

* cited by examiner

*Primary Examiner* — Zachary M Pape
(74) *Attorney, Agent, or Firm* — Cooper & Dunham LLP

(57) ABSTRACT

An information processing apparatus having improved cooling efficiency is disclosed. The information processing apparatus includes a first chassis and a second chassis separated from each other at a prescribed distance, the first chassis accommodating a substrate on which high heat generating parts such as a CPU and a chipset are mounted, and the second chassis accommodating low heat generating and low heat resistance parts. Because of this structure, the first chassis and the second chassis are thermally isolated, and the surface area of the apparatus is increased, thereby improving the cooling efficiency of the apparatus.

13 Claims, 8 Drawing Sheets

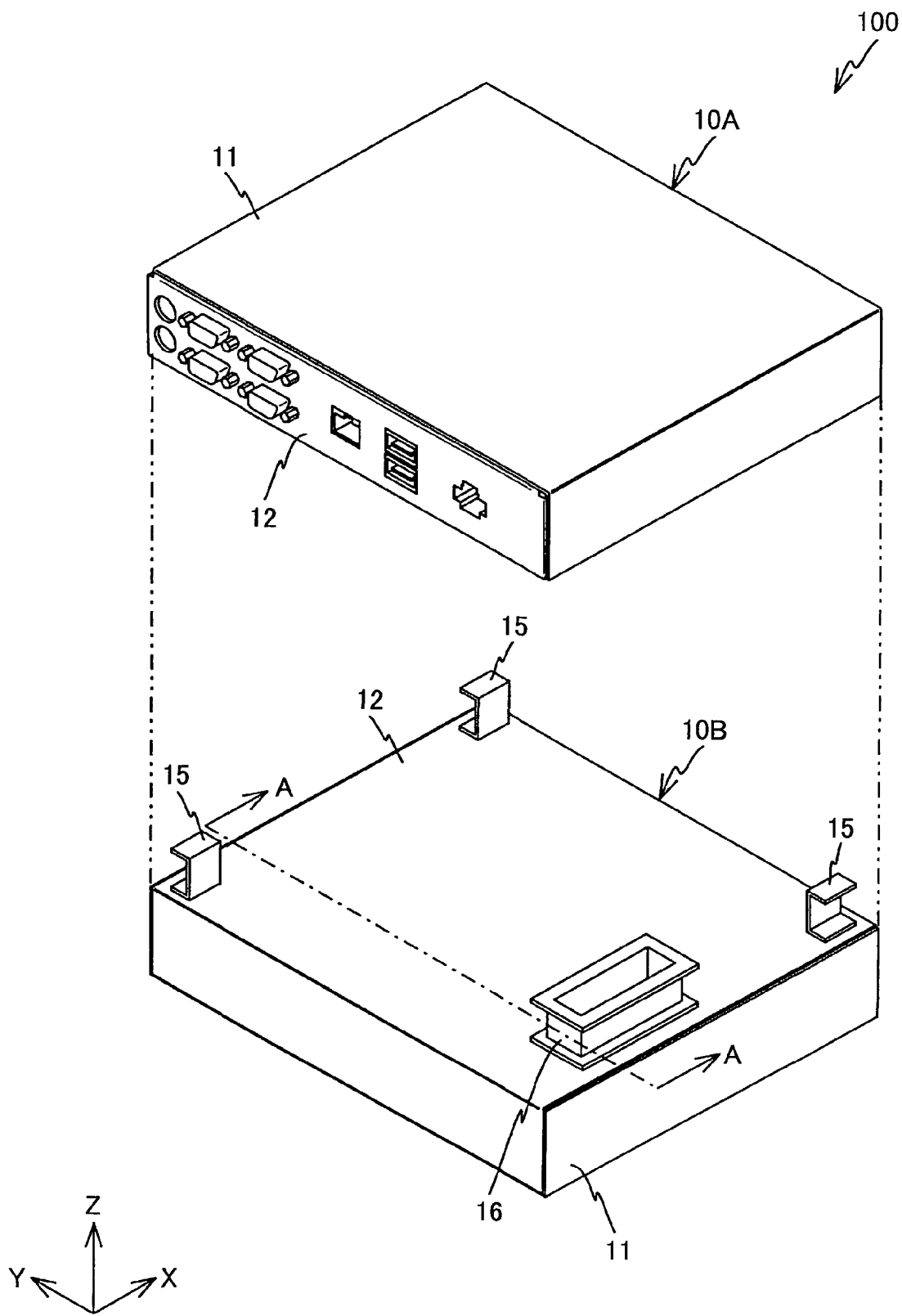

IMAGE PROCESSING APPARATUS WITH HEAT DISSIPATING STRUCTURE

BACKGROUND

1. Technical Field

This disclosure generally relates to an information processing apparatus, and more particularly to an information processing apparatus including a Central Processing Unit (hereinafter referred to as a "CPU").

2. Description of the Related Art

In an information processing apparatus such as a personal computer or a device controller integrated in, for example, a vending machine, as a method of cooling high heat generating parts including a CPU, a natural cooling method is widely adopted. In the natural cooling method, an opening is formed above high heat generating parts, and heat is dissipated outside the casing by rising air currents produced by the high heat generating parts.

However, when an information processing apparatus using the natural cooling method is installed at a site not under environmental control such as in the open air, air currents against the direction of the rising air currents may occur, thereby preventing the generated heat from dissipating from the casing, or foreign material may be introduced into the casing, thereby damaging the apparatus.

BRIEF SUMMARY

The present invention enables an information processing apparatus to be capable of improving cooling efficiency.

According to an aspect of this disclosure, there is provided an information processing apparatus including a central processing unit, a substrate on which the central processing unit is mounted, a first chassis accommodating the substrate; and a second chassis separately disposed on the one side of the first chassis at a predetermined distance.

According to the above aspect, the information processing apparatus includes the first chassis and the second chassis disposed separately by a prescribed distance from the first chassis, and a substrate on which a CPU is mounted is accommodated in the first chassis. Because of this feature, electronic parts accommodated in the second chassis can be isolated from the negative effect of heat from the CPU. Further, since the surface area of the entire information processing apparatus is increased, the cooling efficiency for the electronic parts in the first chassis and the second chassis can be increased.

BRIEF DESCRIPTION OF THE DRAWINGS

Other aspects, features, and advantages will become more apparent from the following descriptions when read in conjunction with the accompanying drawings, in which:

FIG. 5 is a partially exploded view of the information processing apparatus;

DETAILED DESCRIPTION OF THE PREFERRED EMBODIMENTS

Figure 1:
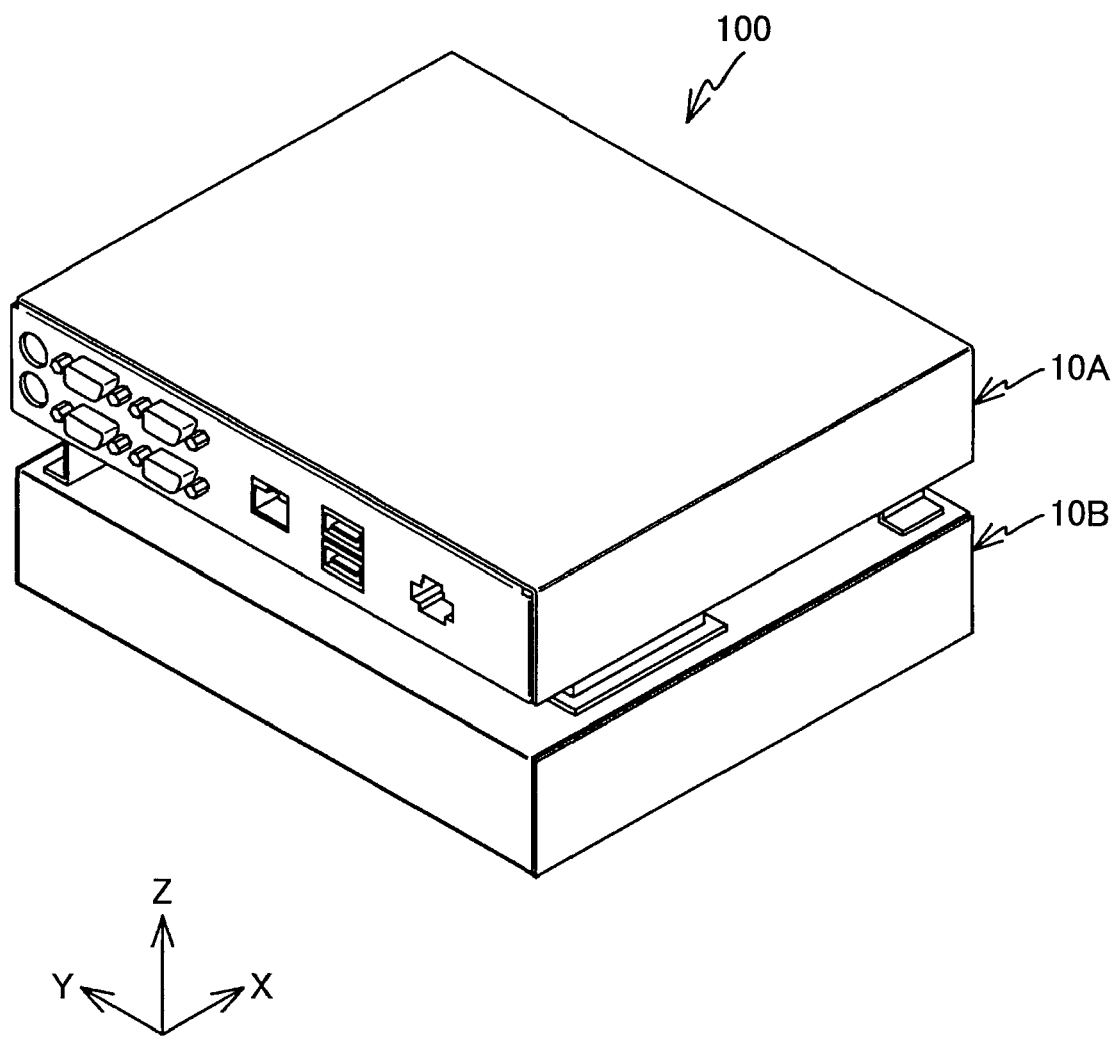
FIG. 1 is a perspective view showing an information processing apparatus according to an embodiment of the present invention.

In the following, an embodiment of the present invention is described with reference to FIGS. 1 through 6. FIG. 1 is a perspective view of an information processing apparatus 100 according to an embodiment of the present invention. The information processing apparatus 100 may be incorporated in, for example, a vending machine or a ticket-vending machine, and includes a first chassis 10A and a second chassis 10B separated from each other by an offset distance so as to extend up and down as shown in FIG. 1.

Figure 2:
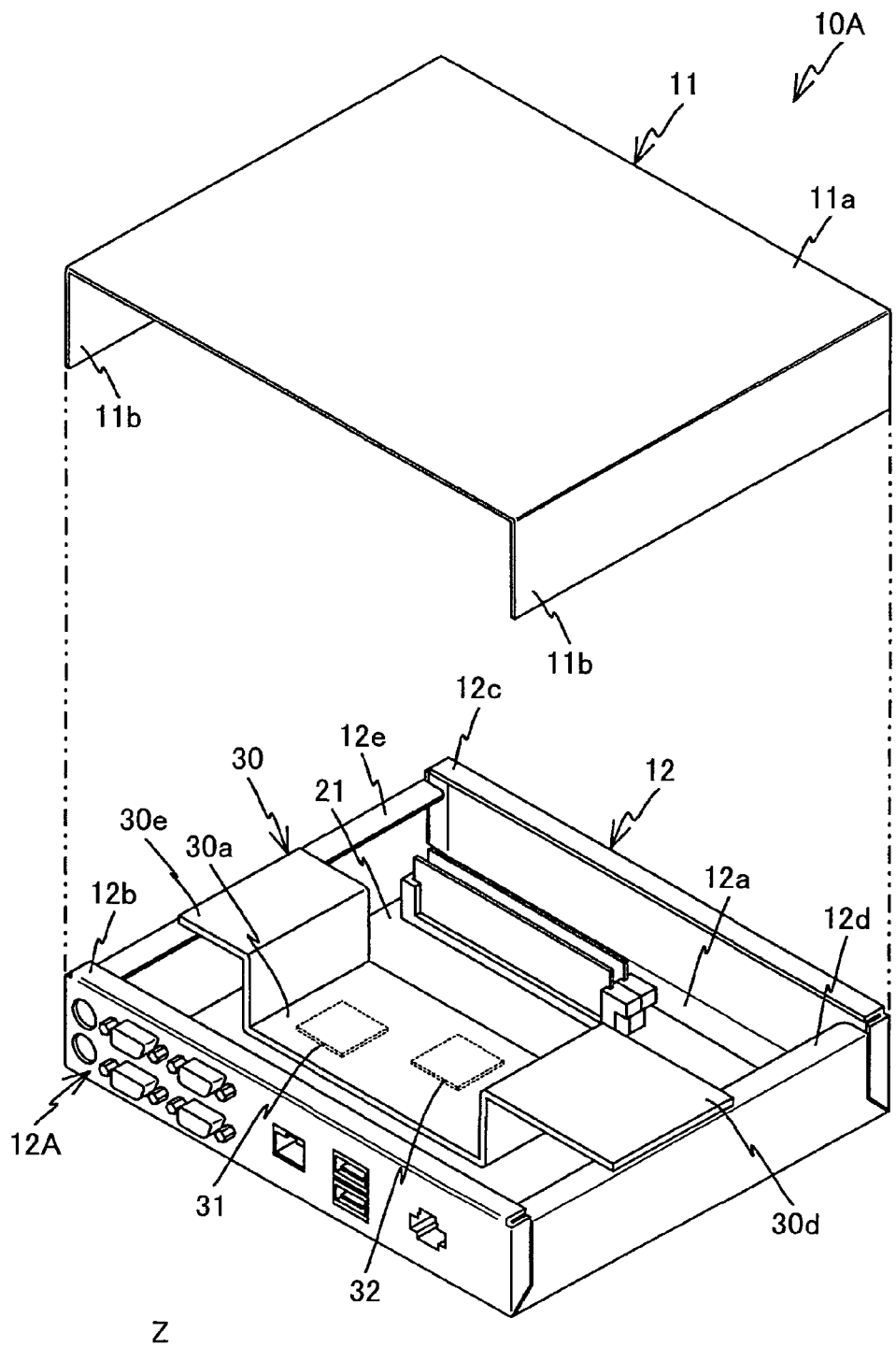
FIG. 2 is a partially exploded perspective view of a first chassis of the information processing apparatus.

FIG. 2 is a partially exploded perspective view of the first chassis 10A. As shown in FIG. 2, the first chassis 10A includes a base 12, a cover 11 engaging the base 12, a substrate 21, and a heat dissipating member 30. The cover 11 engages the base 12. The heat dissipating member 30 dissipates the heat from high heat generating parts on the substrate 21 to the first chassis 10A. An internal space defined by the base 12 and the cover 11 accommodates, for example, the substrate 21 and the heat dissipating member 30.

The base 12 may be formed by applying a sheet metal process to a steel sheet. The base 12 includes a base part 12a, a front wall part 12b, a rear wall part 12c, and fixing parts 12d and 12e. The base part 12a has substantially a square shape in plan view. The front wall part 12b and the rear wall part 12c are formed along a fringe on the –X side and +X side, respectively, of an upper surface of the base part 12a with the longitudinal directions of the front wall part 12b and the rear wall part 12c parallel to the Y axis direction. The two fixing parts 12d and 12e are formed along a fringe on the –Y side and the +Y side, respectively, of the upper surface of the base part 12a with their longitudinal directions parallel to the X axis direction.

Figure 3A:
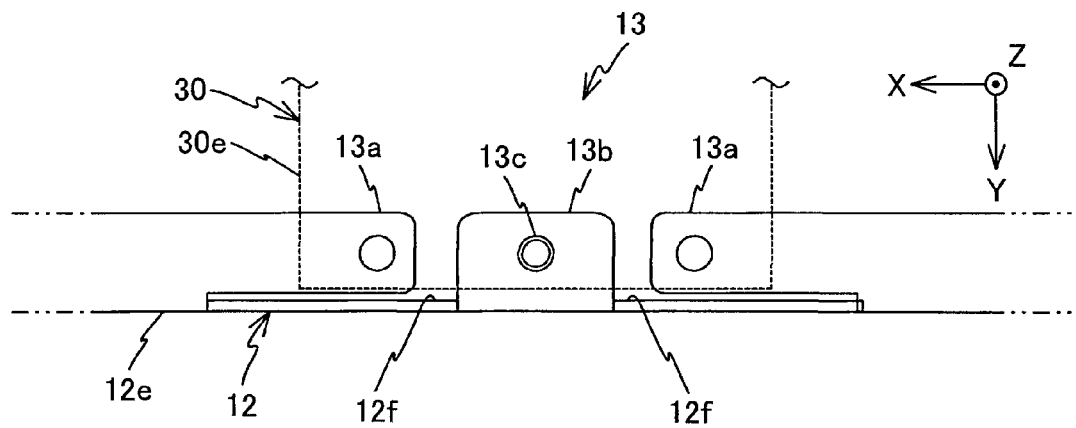
FIGS. 3A and 3B are a plan view and a side view showing a connection part where a base is fixed to a heat dissipating member of the information processing apparatus.

The upper parts of the fixing parts 12d and 12e are folded inside in the horizontal direction so that the folded positions are slightly lower than the tops of the front wall part 12b and the rear wall part 12c. FIG. 3A is a plan view of the fixing part 12e. As shown in FIG. 3A, L-shaped notches 12f are formed on the fixing part 12e so that a connection part 13 in contact with the heat dissipating member 30 can be formed.

Figure 3B:
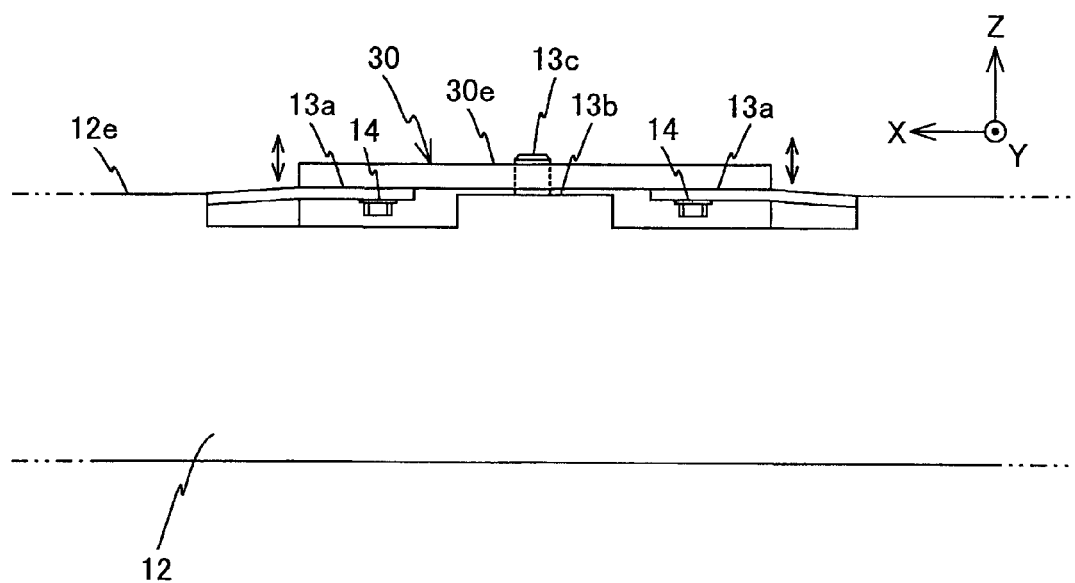

FIGS. 3A and 3B are a plan view and a side view seen from +Y side, respectively, showing the connection part 13 attached to the fixing part 12e. As shown in FIGS. 3A and 3B, the connection part 13 includes two movable parts 13a each in contact with and extending from upper parts of the fixing part 12e in the corresponding +X and –X directions and a position determining part 13b having a substantially rectangular shape and formed between the two movable parts 13a. The ends of the movable parts 13a near the position determining part 13b are movable up and down due to elastic deflection of the movable parts 13a. Further, a cylindrical protruding part 13c extending upward is formed on the upper surface of the position determining part 13b.

An interface 12A is formed on the front wall part 12b. The interface 12A includes a power connector, a USB terminal, a mouse terminal, a serial connector, and a Local Area Network (LAN) adaptor so as to provide electrical connections between the information processing apparatus 100 and external peripherals.

The substrate 21 may be a general-purpose motherboard conforming to ATX standards used in personal computers. There are some electronic parts including high heat generating parts such as a CPU 31 and a chipset 32 mounted on the surface of the substrate 21.

Referring back to FIG. 2, the heat dissipating member 30 may be formed by applying a sheet metal process to an aluminum sheet or a copper sheet having a thickness of several millimeters (mm). The heat dissipating member 30 includes a contacting part 30a and connecting parts 30d and 30e. The contacting part 30a has a substantially rectangular shape with its longitudinal direction parallel to the Y axis direction and is in contact with the CPU 31 and the chipset 32 mounted on the upper surface of the substrate 21. The connection part 30d having an L-shaped vertical cross-section is provided on the −Y side of the contacting part 30a, and is fixed to the fixing part 12d. The connection part 30e having an L-shaped vertical cross-section is provided on the +Y side of the contacting part 30a, and is fixed to the fixing part 12e.

There is a circular opening formed at the center of the +Y side of the connecting section 30e of the heat dissipating member 30. As shown in FIGS. 3A and 3B, while the protruding part 13c on the position determining part 13b is inserted through the circular opening, the end part on the +Y side of the connecting part 30e is fixed to the two movable parts 13a with, for example, screws 14.

Figure 4A:
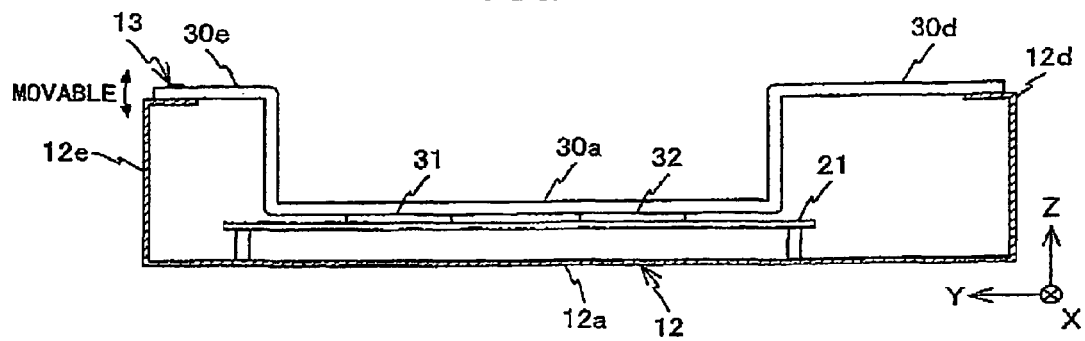
FIG. 4A is a cut-open view showing how the heat dissipating member is in contact with parts on a substrate and the cover.

As described above, the movable parts 13a of the connection part 13 are movable up and down. Because of this feature, as shown in FIG. 4A, even after the lower surface of the contacting part 30a of the heat dissipating member 30 is placed in contact with the CPU 31, and the position of the heat dissipating member 30 is fixed by fixing the connecting part 30d to the fixing part 12d, the connecting part 30e can be easily fixed to the connection part 13a in contact with the fixing part 12e.

Figure 4B:
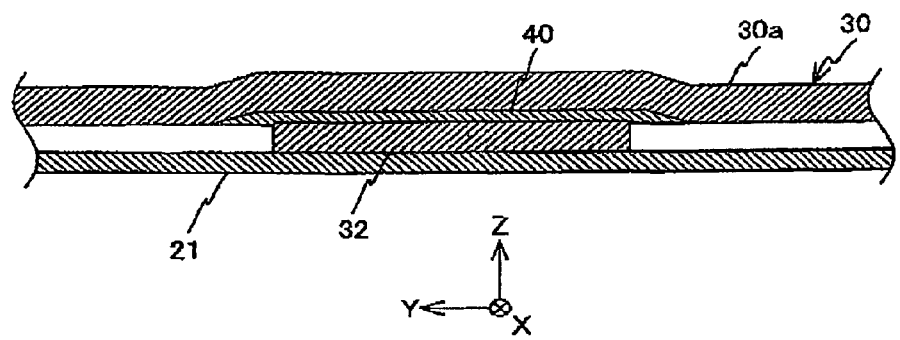
FIG. 4B shows how the heat dissipating member is in contact with a chip set on the substrate.
Figure 4C:
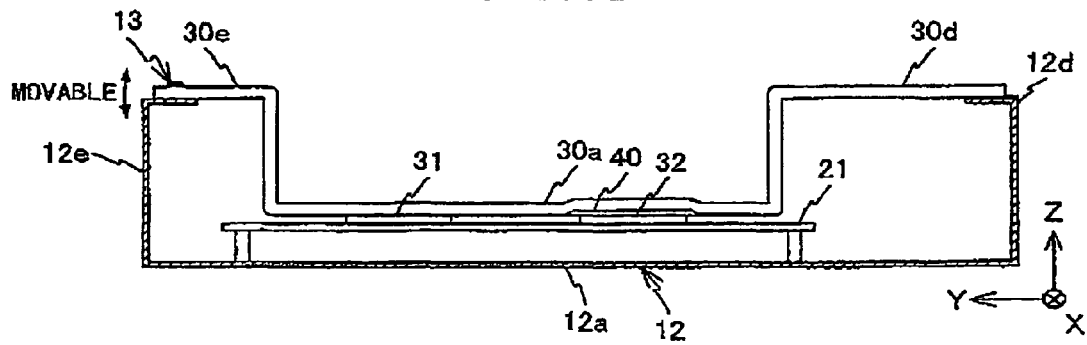
FIG. 4C shows a cut open view when an elastic material is added in the configuration of FIG. 4A.

Further, as shown in FIG. 4B, a concave part is formed on the contacting part 30a of the heat dissipating member 30 so that the concave part faces the chipset 32 mounted on the substrate 21. An elastic material 40 having a relatively high heat conductivity is supplied in the concave part. This configuration provides clearance near the chipset 32, thereby enabling the position of the heat dissipating member 30 to be adjusted with respect to the reference position of the upper surface of the CPU 32.

The cover 11 may be formed by applying a sheet metal process on an anodized aluminum sheet. As shown in FIG. 2, the cover 11 includes a top board part 11a and a pair of side wall parts 11b. The top board part 11a has a substantially square shape in plan view. The pair of side wall parts 11b is formed one part 11b along a fringe on the +Y side and the other part 11b along a fringe on the −Y side of the lower surface of the top board part 11a with the longitudinal directions of the side wall parts 11b parallel to the X axis direction.

As shown in FIG. 2, the cover 11 engages the base 12 by fixing the fixing parts 12d and 12e of the base 12 to the corresponding side wall parts 11b of the cover 11 with, for example, screws so as to be integrated together.

Referring back to FIG. 1, similar to the above first chassis 10A, the second chassis 10B includes the base 12 and the cover 11, and accommodates electronic parts having a low heating value and low heat resistance such as a hard disk (not shown) and a PCI card 23 (see FIG. 6) in the inner space of the second chassis 10B.

FIG. 5 is a partially exploded perspective view of the information processing apparatus 100. As shown in FIG. 5, the first chassis 10A and the second chassis 10B are connected to each other in a manner so that three corner sections of the base 12 of the first chassis 10A are connected to the corresponding three corner sections of the base 12 of the second chassis 10B with U-shaped connecting members 15. As a result of using the connecting members 15, the first chassis 10A and the second chassis 10B are vertically separated from each other by a clearance of, for example, about 15 mm. Further, the inner spaces of the first chassis and the second chassis are in communication with each other through a connecting member 16 having a rectangular opening formed in vertical direction.

Figure 6:
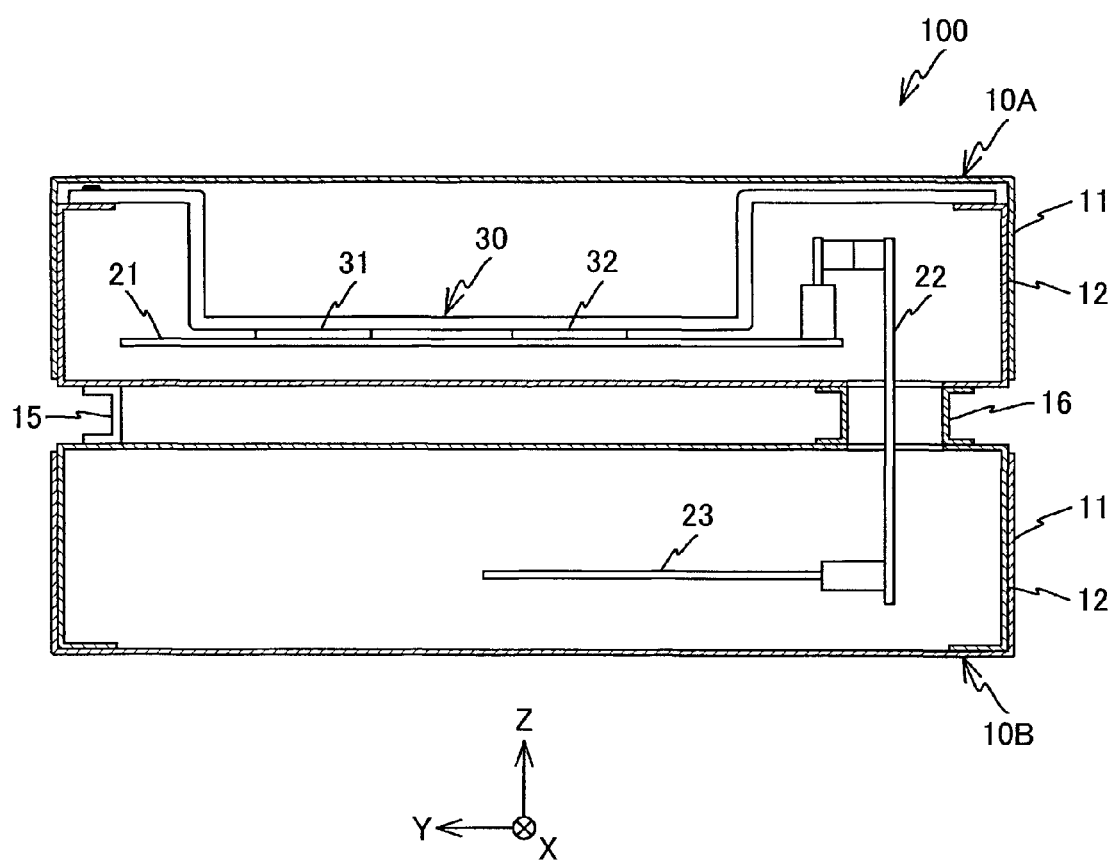
FIG. 6 is a cross-sectional view cut along A-A line in FIG. 5.

FIG. 6 is a cross-sectional view taken along A-A line of FIG. 5. As shown in FIG. 6, in the information apparatus 100, the electronic parts such as a hard disk and the PCI card 23 accommodated in the second chassis 10B are electrically connected to the electronic parts such as the substrate 21 accommodated in the first chassis 10A via an electric circuit provided in a connecting substrate 22 disposed between the inside of the second chassis 10B and the inside of the first chassis 10A through the inside of the connecting member 16.

As described above, the information processing apparatus 100 according to this embodiment of the present invention includes the first chassis 10A and the second chassis 10B so that the second chassis 10B is separated downward from the first chassis 10A by a prescribed distance. Further, the first chassis 10A accommodates the substrate 21 on which high heat generating parts such as the CPU 31 and the chipset 32 are mounted. On the other hand, the second chassis 10B mainly accommodates electronic parts having a low heating value and low heat resistance such as a hard disk and a PCI card 23.

Because of this configuration, the first chassis 10A and the second chassis 10B are mostly thermally isolated from each other. As a result, thermal influence on the electronic parts accommodated in the second chassis 10B can be reduced. Further, the electronic parts are separately accommodated in the first chassis 10A and the second chassis 10B, so that it is possible to increase the area of surfaces for dissipating the heat generated from the electronic parts accommodated in the first chassis 10A and the second chassis 10B, thereby improving the cooling efficiency of the information processing apparatus 100.

It should be noted that main parts where heat is generated in the information processing apparatus 100 are the CPU 31 and the chipset 32 mounted on the substrate 21. However, the heat generated from the CPU 31 and the chipset 32 is transferred to the first chassis 10A through the heat dissipating member 30 in contact with the CPU 31 and the chipset 32. As a result, the first chassis 10A works as a heat sink, and the heat generated from the CPU 31 and the chipset 32 is effectively dissipated to the outside, thereby improving the cooling efficiency of the information processing apparatus 100.

Further, it is not necessary to form an opening in the first chassis 10A and the second chassis 10B to improve the cooling efficiency of the apparatus 100, thereby providing a dust preventing structure. Because of this structure, the information processing apparatus 100 can maintain stable operations regardless of the environment in which the apparatus is installed.

Still further, in the information processing apparatus 100 according to this embodiment of the present invention, the inner spaces of the first chassis 10A and the second chassis 10B are in communication with each other through a connecting member 16, and the electronic parts such as a hard disk and the PCI card 23 accommodated in the second chassis 10B are electrically connected with the substrate 21 accommodated in the first chassis 10A via the connecting substrate 22 disposed inside of the connecting member 16. Because of this structure, the airtightness of the inner spaces of the first chassis 10A and the second chassis 10B is improved, thereby improving the reliability of the apparatus 100 in a severe operating environment.

Still further, in the information processing apparatus 100 according to this embodiment of the present invention, the bases 12 of the first chassis 10A and the second chassis 10B are formed by applying a sheet metal process to a steel sheet having low heat conductivity. On the other hand, the covers 11 of the first chassis 10A and the second chassis 10B are formed by applying a sheet metal process to an aluminum sheet having high heat conductivity. Because of this arrangement, it becomes possible to reduce the heat dissipation in the space between the first and the second chassis and it becomes possible to increase the heat dissipation through the cover sides of the first chassis 10A and the second chassis 10B. As a result, it is possible to improve the heat insulation effect between the first chassis 10A and the second chassis 10B.

Still further, when a metal glossy surface is applied to the surface of the bases 12 of the first chassis 10A and the second chassis 10B, it is possible to further reduce the heat dissipation in the space between the first chassis and the second chassis and further increase the heat dissipation through the cover sides of the first chassis 10A and the second 10B.

Figure 7:
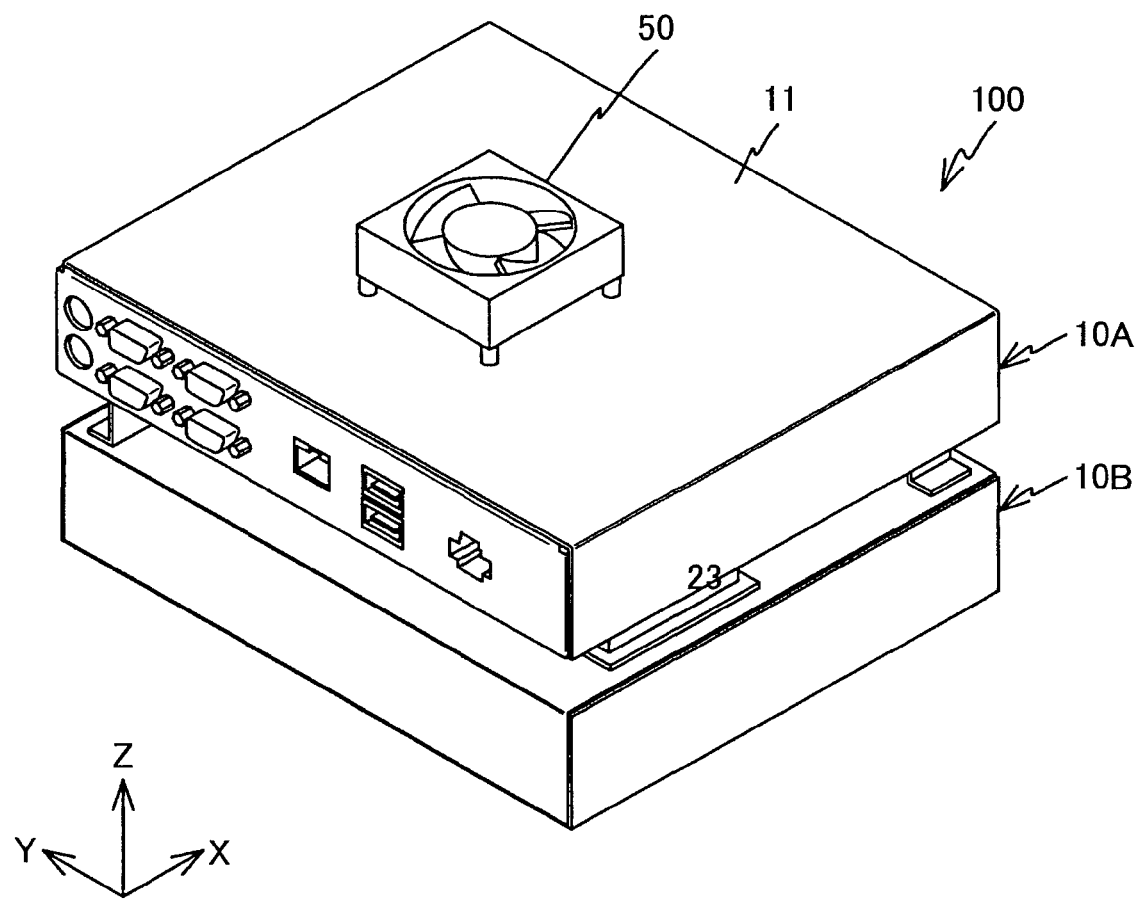
FIG. 7 is a perspective view showing a first modified embodiment of the information processing apparatus.

Still further, in the information processing apparatus 100 according to this embodiment of the present invention, the high heat generating parts are accommodated in the first chassis 10A, and the heat dissipating through the cover 11 of the first chassis 10A is greater than that of any other cover or base. In view of this point, for example, as shown in FIG. 7, a cooling fan 50 is mounted on an outer wall surface of the cover 11 of the first chassis 10A so as to provide cool air to the cover 11 by the cooling fan 50. As a result, the cooling efficiency of the first chassis 10A can be further improved.

Figure 8A:
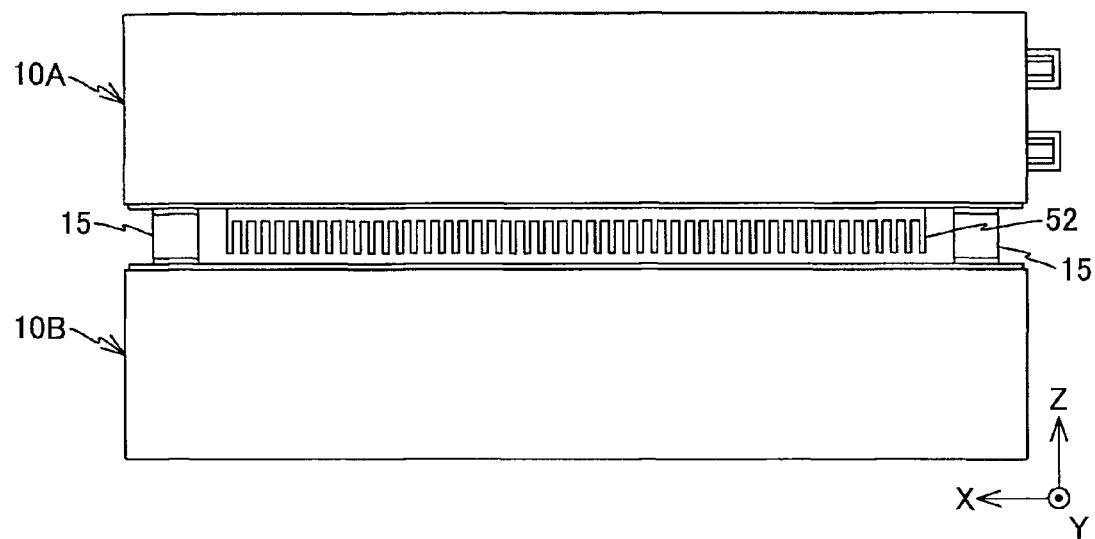
FIGS. 8A and 8B are drawings showing second and third modified embodiments, respectively, of the information processing apparatus.

Still further, as shown in FIG. 8A, a cooling mechanism such as cooling fins may be provided in, for example, the space between the first chassis 10A and the second chassis 10B. By doing this, it is possible to improve the heat dissipation efficiency of the first chassis 10A and the second chassis 10B.

Figure 8B:
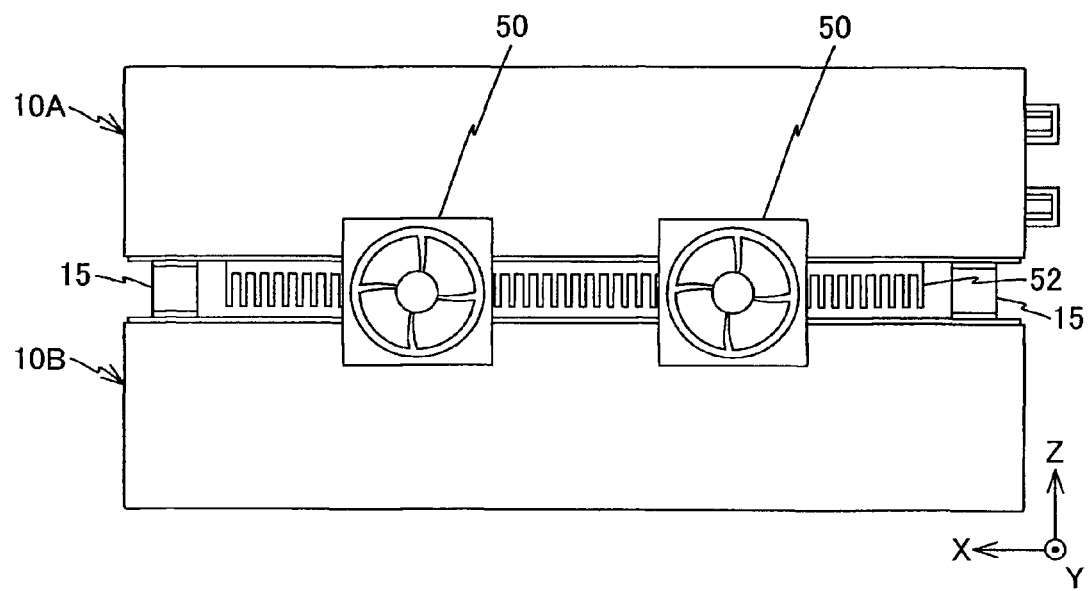

In this case, preferably, the cooling fins are formed on the first chassis 10A, which dissipates more heat. Further, it is preferable that the arranging direction of the cooling fins be generally perpendicular to the direction of cooling air flow. For example, though it is not shown in the figures, when both the first chassis 10A and the second chassis 10B are upright side by side, namely when the second chassis 10B is horizontally separated from the first chassis 10A by some distance, it is preferable that the arranging direction of the cooling fins be parallel to the horizontal direction so as not to block rising air between the first chassis 10A and the second chassis 10B. Still further, for example, as shown in FIG. 8B, when a cooling fan 50 for introducing cooling air into the space between the first chassis 10A and the second chassis 10B is provided, it is also preferable that the arranging direction of the cooling fins 52 be generally perpendicular to the direction parallel to the flow of the cooling air produced by the cooling fan 50.

Still further, according to this embodiment of the present invention, the movable parts 13a of the connection part 13 are movable up and down. Because of this feature, as shown in FIG. 4A, even after the lower surface of the contacting part 30a of the heat dissipating member 30 is in contact with the CPU 31, and the position of the heat dissipating member 30 is fixed by fixing the connecting part 30d to the fixing part 12d, the connecting part 30e can be easily fixed to the connection part 13 in contact with the fixing part 12e. As a result, when the position of the heat dissipating member 30 is determined based on, for example, the position of the CPU 31 (for it is assumed that the CPU 31 dissipates more heat than the chipset 32), the heat dissipating member 30 can be easily fixed to the fixing parts 12d and 12e of the base 12.

Further, as shown in FIG. 4B, a concave part is formed on the contacting part 30a of the heat dissipating member 30 so that the concave part faces the chipset 32 mounted on the substrate 21. An elastic material 40 having a relatively high heat conductivity is supplied in the concave part. This configuration provides clearance near the chipset 32, thereby enabling the position of the heat dissipating member 30 to be adjusted with respect to the reference position of the upper surface of the CPU 32 even when the thickness of the CPU 31 is different from that of the chipset 32. As a result, the cooling efficiency of the first chassis 10A can be improved. In addition, since the elastic material 40 is adhered to the upper surface of the chipset 32, the heat from the chipset 32 can be effectively dissipated to the outside through the chassis 10A (see FIG. 4C).

It should be noted that when the difference between the thicknesses of the CPU 31 and the chipset 32 is negligible, the elastic member 40 may not be supplied between the chipset 32 and the heat dissipating member 30. Further, the connection part 13 may be provided not only on the fixing part 12e of the base 12 but also on the fixing part 12d of the base 12.

Still further, in the information processing apparatus 100 according to this embodiment of the present invention 100, the second chassis 10B accommodates electronic parts such as hard disk drive and the PCI card 23 that need to be periodically exchanged or maintained (hereinafter referred to as "exchange parts"). Because of this structure, only exchange parts can be exposed without exposing precision parts such as the substrate 21, thereby preventing the precision parts such as the substrate 21 from being damaged and preventing the parts such as a screw from being introduced into the inner space of the first chassis 10A.

Still further, when the heat dissipation from the CPU 31 is low, the heat dissipating member 30 may not be used. On the other hand, when heat dissipation from the CPU 31 is high, the size of the heat dissipating member 30 may be enlarged. Still further, another cooling mechanism as well as the heat dissipating member 30 may be jointly used.

Still further, the electronic parts accommodated in the information processing apparatus 100 are not limited to the parts described above in this embodiment of the present invention. For example, a CF card or a SD memory card or any other electronic parts may be accommodated in the chassis 10B. The important point is that high heat generating parts and low heat generating parts, or high heat resistance parts and low heat resistance value are separately accommodated in the first chassis 10A and the second chassis 10B.

Further, in the above description, the information processing apparatus 100 is horizontally installed. However, the embodiment of the present invention is not limited to this configuration. For example, the information processing apparatus 100 may be vertically installed (the chassis 10A and the chassis 10B are upright side by side).

As described above, the information processing apparatus according to an embodiment of the present invention is applicable to, for example, a controller that can be integrated into an external system.

The present invention is not limited to the above embodiments, and variations and modifications may be made without departing from the scope of the present invention.

The present application is based on and claims the benefit of priority of Japanese Patent Application No. 2007-128799, filed on May 15, 2007, the entire contents of which are hereby incorporated herein by reference.

What is claimed is:

1. An information processing apparatus with heat dissipating structure comprising:
   a central processing unit;
   a heat generating module generating heat when being operated;
   a substrate on which the central processing unit and the heat generating module are mounted;
   a chassis configured to contain the substrate; and
   a heat dissipating member accommodated in an internal space defined by the chassis, made of a single plate, and configured to be in thermal contact with the chassis at both ends of the heat dissipating member, wherein
   the heat dissipating member is further in thermal contact with the central processing unit and the heat generating module in a manner such that the central processing unit and the heat generating module are sandwiched between the heat dissipating member and the substrate to dissipate heat from the central processing unit and the heat generating module to the chassis,
   wherein the chassis includes a base and a cover that engages the base,
   the base includes a fixing part including two movable parts that are in thermal contact with a first end of the heat dissipating member,
   the fixing part further including a position determining part disposed between the two movable parts and a protruding part that extends from the position determining part, and
   a through hole is formed on the first end of the heat dissipating member, and the protruding part extends through the through hole, so that the first end of the heat dissipating member and the two movable parts are jointly movable in a direction perpendicular to a surface of the first end of the heat dissipating member and respective surfaces of the two movable parts.

2. The information processing apparatus with heat dissipating structure according to claim 1, further comprising:
   an elastic material sandwiched between the heat dissipating member and the heat generating module, wherein
   the heat dissipating member has a concave part for containing the elastic material.

3. The information processing apparatus with heat dissipating structure according to claim 2, wherein
   the heat dissipating member is movably connected to the chassis at one of the ends of the heat dissipating member in the direction parallel to the contacting direction.

4. The information processing apparatus with heat dissipating structure according to claim 3, wherein
   the heat dissipating member is movably connected to the chassis at one end of the heat dissipating member, the one end being closer to the central processing unit than the other end.

5. The information processing apparatus with heat dissipating structure according to claim 1, wherein
   the heat generating module is a chipset.

6. The information processing apparatus with heat dissipating structure according to claim 1, further comprising:
   a connecting member, wherein
   the chassis includes:
       a first chassis; and
       a second chassis separately disposed on one side of the first chassis at a predetermined distance, and
   the first chassis contains
       the central processing unit; and
       the heat generating module,
   the second chassis contains
       some electronic modules,
   the connecting member communicates between an inner space of the first chassis and an inner space of the second chassis.

7. The information processing apparatus with heat dissipating structure according to claim 6, wherein
   the heat conductivity of a first surface of the first chassis and a second surface of the second chassis, the first surface facing the second chassis, the second surface facing the first chassis, is lower than that of a third surface of the first chassis and a fourth surface of the second chassis, the third surface being opposite to the first surface of the first chassis, the fourth surface being opposite to the second surface.

8. The information processing apparatus with heat dissipating structure according to claim 6, further comprising:
   a fan configured to cool at least the first chassis.

9. The information processing apparatus with heat dissipating structure according to claim 6, further comprising:
   a cooling mechanism provided between the first chassis and the second chassis, the cooling mechanism including plural fins for dissipating heat at least on a surface of the first chassis.

10. The information processing apparatus with heat dissipating structure according to claim 9, wherein
    the first chassis and the second chassis are horizontally installed, and
    an arranging direction of the plural fins is parallel to the horizontal direction.

11. The information processing apparatus with heat dissipating structure according to claim 9, further comprising:
    a fan for cooling the cooling mechanism.

12. The information processing apparatus according to claim 1, further comprising:
    a connecting member that connects the chassis and a second chassis separately disposed on one side of the chassis at a predetermined distance; and
    a cooling mechanism provided between the chassis and the second chassis.

13. The information processing apparatus according to claim 1, wherein the first end of the heat dissipating member and the two movable parts are jointly movable in order to adjust a clearance between the heat dissipating member and both (a) the central processing unit and (b) the heat generating module.

* * * * *

UNITED STATES PATENT AND TRADEMARK OFFICE
CERTIFICATE OF CORRECTION

| | | Page 1 of 1 |
|---|---|---|
| PATENT NO. | : 7,961,471 B2 | |
| APPLICATION NO. | : 12/115826 | |
| DATED | : June 14, 2011 | |
| INVENTOR(S) | : Satoshi Odanaka and Hayato Watanabe | |

It is certified that error appears in the above-identified patent and that said Letters Patent is hereby corrected as shown below:

Replace the Title section (54) on the cover page of the patent, with the following:

-- (54) INFORMATION PROCESSING APPARATUS WITH HEAT
DISSIPATING STRUCTURE --

Replace the Title on column 1 of the patent, with the following:

-- INFORMATION PROCESSING APPARATUS
WITH HEAT DISSIPATING STRUCTURE --

Signed and Sealed this
Thirtieth Day of August, 2011

David J. Kappos
*Director of the United States Patent and Trademark Office*